United States Patent
Choi et al.

(10) Patent No.: US 10,902,806 B2
(45) Date of Patent: Jan. 26, 2021

(54) HALF-POWER BUFFER AMPLIFIER, SOURCE DRIVER, AND DISPLAY APPARATUS INCLUDING THE SAME

(71) Applicant: DB HiTek Co., Ltd., Seoul (KR)

(72) Inventors: Dong Gwi Choi, Seoul (KR); Mun Gyu Kim, Seoul (KR)

(73) Assignee: DB HiTek Co., Ltd., Seoul (KR)

( * ) Notice: Subject to any disclaimer, the term of this patent is extended or adjusted under 35 U.S.C. 154(b) by 14 days.

(21) Appl. No.: 16/446,221

(22) Filed: Jun. 19, 2019

(65) Prior Publication Data

US 2020/0035175 A1     Jan. 30, 2020

(51) Int. Cl.
  *G09G 3/36*      (2006.01)
  *H03K 19/0175*   (2006.01)
  *H03K 3/037*     (2006.01)
  *H03F 3/45*      (2006.01)

(52) U.S. Cl.
  CPC ......... *G09G 3/3648* (2013.01); *G09G 3/3685* (2013.01); *H03F 3/45076* (2013.01); *H03K 3/037* (2013.01); *H03K 19/017509* (2013.01); *G09G 2310/0286* (2013.01); *G09G 2310/0291* (2013.01); *H03F 2200/375* (2013.01)

(58) Field of Classification Search
  CPC ............... G09G 3/3688; G09G 3/3614; G09G 2310/0289; G09G 2310/0291; G09G 2330/021; H03F 3/45179; H03F 2203/45354; H03F 2203/45344; H03F 2200/421
  See application file for complete search history.

(56) References Cited

U.S. PATENT DOCUMENTS

| | | | |
|---|---|---|---|
| 2009/0039959 A1* | 2/2009 | An ........................ | H03F 3/3022 330/255 |
| 2010/0182297 A1* | 7/2010 | Lan ...................... | G09G 3/3614 345/211 |

* cited by examiner

*Primary Examiner* — Alexander Eisen
*Assistant Examiner* — Kebede T Teshome
(74) *Attorney, Agent, or Firm* — Andrew D. Fortney; Central California IP Group, P.C.

(57) ABSTRACT

A half-power buffer amplifier is disclosed. The amplifier includes an amplification unit configured to differentially amplify differential input signals, the amplification unit including nodes configured to output differentially amplified first to fourth output signals, a first output buffer unit including first and second transistors, and an output node to which the first and second transistors are connected, a second output buffer unit including third and fourth transistors, wherein the third and fourth transistors are connected to the output node, a first control switch between the first output node and the second transistor and controlled by a polarity control signal, and a second control switch between the second output node and the third transistor and controlled by a complement of the polarity control signal.

14 Claims, 6 Drawing Sheets

FIG. 5

HALF-POWER BUFFER AMPLIFIER, SOURCE DRIVER, AND DISPLAY APPARATUS INCLUDING THE SAME

This application claims the benefit of Korean Patent Application No. 10-2018-0085805, filed on Jul. 24, 2018, which is hereby incorporated by reference as if fully set forth herein.

BACKGROUND OF THE INVENTION

Field of the Invention

Embodiments of the present invention relate to a half-power buffer amplifier, a source driver, and a display apparatus including the same.

Discussion of the Related Art

A liquid crystal display apparatus generally includes pixels in the form of a matrix consisting of rows and columns. Each pixel may include a thin film transistor and a pixel electrode on a substrate. The gates of the thin film transistors of the same row may be connected together through a gate line and may be controlled by a gate driver.

The sources of thin film transistors of the same column may also be connected together through a source line and may be controlled by a source driver.

As the liquid crystal display apparatus increases in resolution, the source driver should contain a larger number of output buffers, which leads to an increase in power consumption. In a mobile device, power consumption in the liquid crystal display apparatus may determine the available run time. As such, a low-power buffer is indispensable to the liquid crystal display apparatus of the mobile device.

Figure 4:
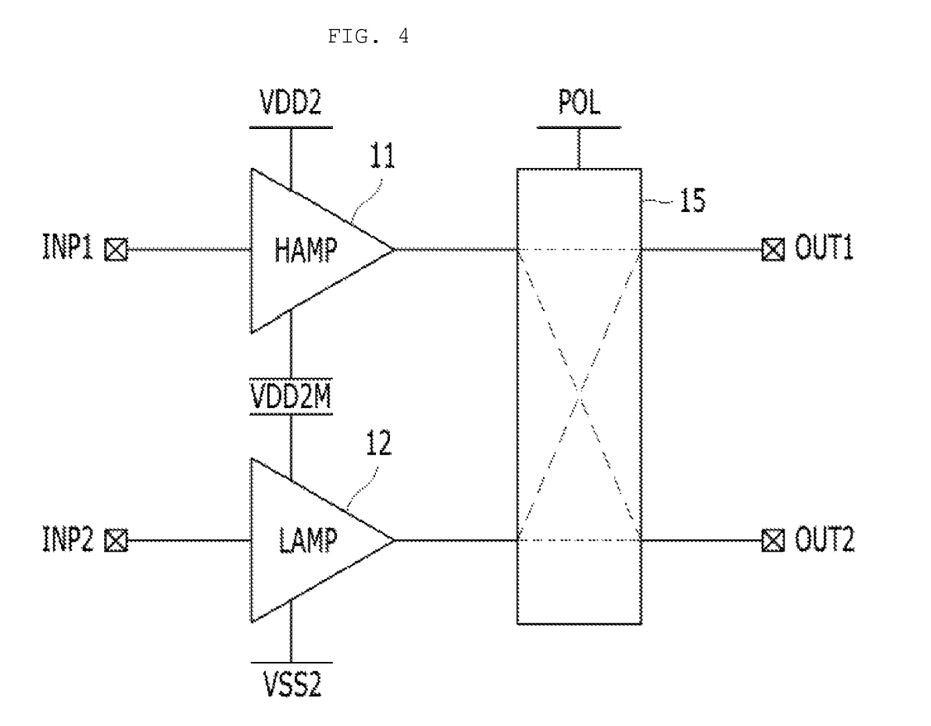
FIG. 4 is a schematic view of a conventional half-power output buffer.

FIG. 4 shows the configuration of a conventional half-power output buffer.

Referring to FIG. 4, in a first line time, a first buffer 11 for a first channel INP1 may output a first half power (for example, VDD2M or VDD2) as a first output signal OUT1 by a selective connection of an output multiplexer 15. At the same time, a second buffer 12 for a second channel INP2 may output a second half power (for example, VSS2 or VDD2M) as a second output signal OUT2 by the selective connection of the output multiplexer 15.

In a second line time subsequent to the first line time, by the output multiplexer 15, the first buffer 11 may output the first half power as the second output OUT2, and the second buffer 12 may output the second half power as the first output OUT1. The output multiplexer 15 may be switched in response to a polarity control signal POL, and may perform a dot inversion. In this case, the output multiplexer 15 may include a separate charge share switch for a charge share function. In order to guarantee that the output of the output multiplexer 15 has a high slew rate, it is necessary to reduce an ON-resistance (Ron) of the output multiplexer 15. Reducing the ON-resistance (Ron) of the output multiplexer 15 necessitates an increase in the size of the transistor that implements a switch in the output multiplexer 15.

It is impossible to properly remove offsets from the different buffers 11 and 12, thereby causing degradation in the display quality. For example, when the offsets from the first buffer 11 and second buffer 12 are opposite in direction, the offset characteristics may accumulate. Matching pair transistors may be provided to meet offset performance, and the offset characteristics may be improved by increasing the sizes of the matching pair transistors. However, this may result in an increase in chip area.

SUMMARY OF THE INVENTION

Accordingly, embodiments of the present invention are directed to a half-power buffer amplifier, and a source driver and a display apparatus including the same that substantially obviate one or more problems due to limitations and disadvantages of the related art.

An object of certain embodiments is to provide a half-power buffer amplifier that is capable of removing a body effect and, in turn, a threshold voltage increase in transistors of an output unit to improve driving performance. Embodiments of the present invention also include a source driver and a display apparatus including the half-power amplifier.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure(s) particularly pointed out in the written description and claims hereof, as well as the appended drawings.

To achieve these objects and other advantages and in accordance with the purpose(s) of the invention, as embodied and broadly described herein, the half-power buffer amplifier includes (i) an amplification unit configured to differentially amplify differential input signals, the amplification unit including first to fourth nodes configured to output differentially amplified output signals, a first output buffer unit including a first transistor and a second transistor between a first voltage source having a first voltage and a second voltage source having a second voltage, and an output node to which the first and second transistors are connected, the first transistor having a gate connected to the first node, the second transistor having a gate connected to the second node, a second output buffer unit including a third transistor and a fourth transistor between a third voltage source having a third voltage and the second voltage source, wherein the third and fourth transistors are connected to the output node, the third transistor having a gate connected to the third node, the fourth transistor having a gate connected to the fourth node, a first control switch between the first output node and the second transistor and controlled by a polarity control signal, a second control switch between the second output node and the third transistor and controlled by a complement of the polarity control signal, and a connection node between the second transistor and the third transistor, connected to the second voltage source.

The half-power buffer amplifier may further include a first switch between the connection node and the gate of the second transistor, and a second switch between the connection node and the gate of the third transistor, wherein the first switch and the second switch may be turned on or off opposite to each other (i.e., when the first switch is on, the second switch is off, and when the first switch is off, the second switch is on).

Each of the first switch and second switch may be turned on or off based on or in response to the polarity control signal (and, e.g., the complement of the polarity control signal).

The first voltage may be higher than the second voltage, and the second voltage may be higher than the third voltage.

The second transistor may have a source and a body electrically connected together, and the third transistor may have a source and a body electrically connected together.

The source of the second transistor and the source of the third transistor may each be connected to the connection node.

The half-power buffer amplifier may further include a first connection switch between the first node and the gate of the first transistor, a second connection switch between the second node and the gate of the second transistor, a third connection switch between the third node and the gate of the third transistor, and a fourth connection switch between the fourth node and the gate of the fourth transistor.

The half-power buffer amplifier may further include a first driving switch between the first voltage source and the gate of the first transistor, and a second driving switch between the third voltage source and the gate of the fourth transistor.

The half-power buffer amplifier may further include a first charge share switch unit including first and second charge share switches between the gate of the second transistor and the first voltage source, and a second charge share switch unit including third and fourth charge share switches between the gate of the third transistor and the third voltage source.

The first charge share switch may be turned on or off based on or in response to a first charge share control signal, the third charge share switch may be turned on or off based on or in response to a second charge share control signal, and each of the second charge share switch and fourth charge share switch may be turned on or off based on or in response to the polarity control signal.

The second charge share switch and the fourth charge share switch may be transistors having opposite polarities or carrier types (e.g., n-type or p-type).

Each of the first and second connection switches may be or comprise a P-type transistor, and each of the third and fourth connection switches may be or comprise an N-type transistor.

Each of the first and second connection switches may be turned on or off by a first signal, and each of the third and fourth connection switches may be turned on or off by a second signal.

The first driving switch may be turned on or off by a third signal, and the second driving switch may be turned on or off by a fourth signal, wherein the third signal may be or comprise an inverted first signal, and the fourth signal may be or comprise an inverted second signal.

According to one or more other embodiments, a source driver includes a latch unit configured to store data, a level shifter unit configured to shift a voltage level of data from the latch unit, a digital-to-analog converter unit configured to convert an output from the level shifter unit into an analog signal, and an output buffer comprising the present half-power buffer amplifier, configured to amplify and output the analog signal.

According to one or more other embodiments, a display apparatus includes a display panel including gate lines, data lines, and pixels connected to the gate lines and the data lines, the pixels being in a matrix including rows and columns, the present source driver, configured to drive the data lines, and a gate driver, configured to drive the gate lines.

It is to be understood that both the foregoing general description and the following detailed description of various embodiments of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings.

DETAILED DESCRIPTION OF THE INVENTION

Reference will now be made in detail to embodiments of the present invention, examples of which are illustrated in the accompanying drawings.

In the following description of various embodiments, it will be understood that, when an element is referred to as being "on" or "under" another element, it can be directly on or under the other element or can be indirectly on or under the other element with one or more intervening elements therebetween. Furthermore, when the expression "on" or "under" is used herein, it may involve not only the upward direction, but also the downward direction, with reference to one element.

In addition, it will be understood that relative terms used hereinafter such as "first", "second", "on"/"above"/"over" and "under"/"below"/"beneath" may be construed only to distinguish one element from another element without necessarily requiring or involving a certain physical or logical relation or sequence between the elements. In addition, the same reference numerals will be used throughout the drawings to refer to the same or like parts.

The terms "including", "comprising", "having" and variations thereof disclosed herein mean "including but not limited to" unless expressly specified otherwise, and, as such, should not be construed to exclude elements other than the elements disclosed herein, but may be construed to further include additional elements. In addition, the terms "corresponding" and variations thereof disclosed herein may encompass at least one of the meanings of "facing," "overlapping" and "in a unique or 1:1 relationship".

Figure 1A:
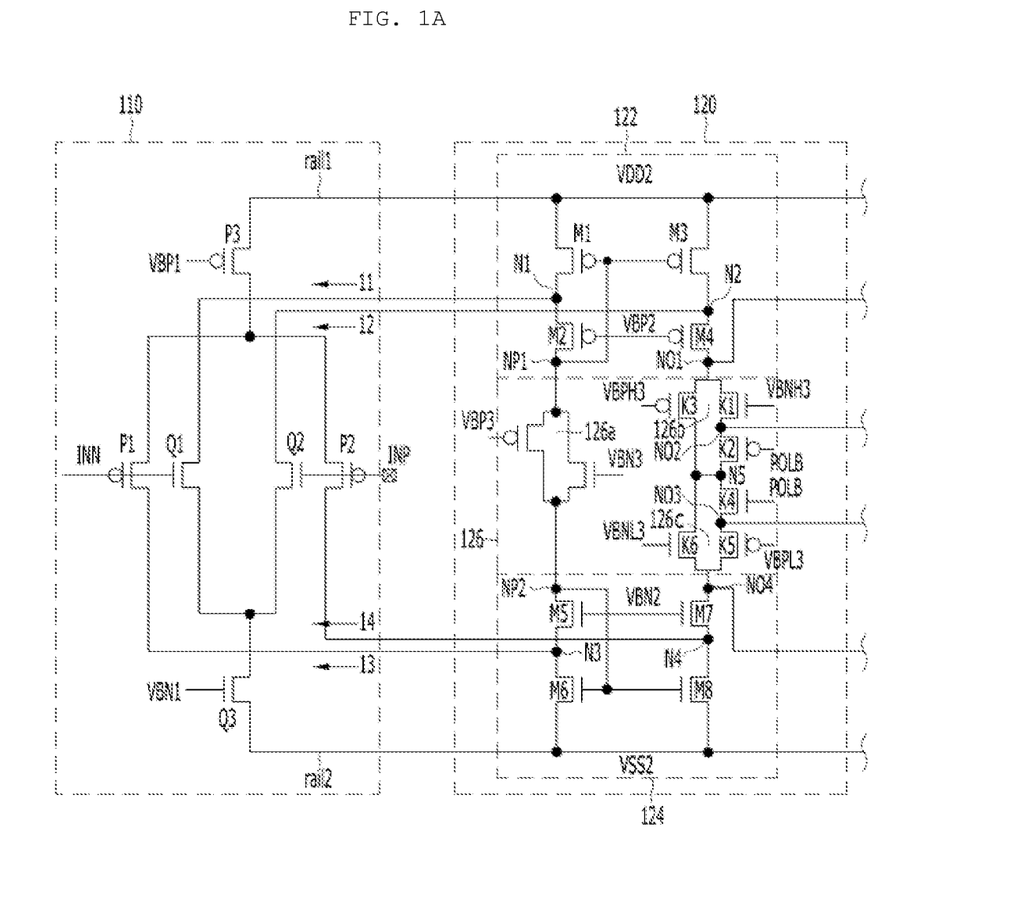
FIG. 1A is a circuit diagram of an input unit and an amplification unit of an exemplary half-power buffer amplifier according to an embodiment of the present invention.
Figure 1B:
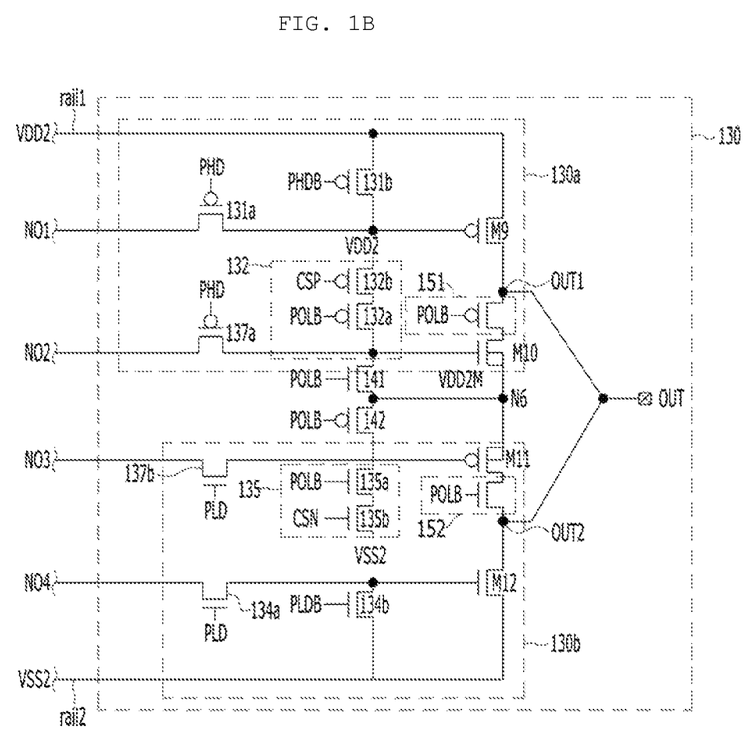
FIG. 1B is a circuit diagram of an output unit of the exemplary half-power buffer amplifier according to an embodiment of the present invention.

FIGS. 1A-1B show the configuration of an exemplary half-power buffer amplifier according to an embodiment.

FIG. 1A is a circuit diagram of an input unit 110 and an amplification unit 120 of the exemplary half-power buffer amplifier according to the embodiment. FIG. 1B is a circuit diagram of an output unit 130 of the exemplary half-power buffer amplifier according to the embodiment.

The half-power buffer amplifier includes the input unit 110 (FIG. 1A), the amplification unit 120 (FIG. 1A), and the output unit 130 (FIG. 1B). Here, the input unit 110 and the amplification unit 120 may collectively be referred to as a "first output stage", and the output unit 130 may be referred to as a "second output stage".

The half-power buffer amplifier may be or comprise a rail-to-rail amplifier. For example, according to the present embodiment, the accumulation of the offsets from the first buffer 11 and second buffer 12 described with reference to FIG. 4 may be alleviated by the "first output stage" and "second output stage" of the half-power buffer amplifier.

A "rail" may refer to the highest level (for example, VDD2) or the lowest level (for example, VSS2) of a supply voltage. The rail-to-rail amplifier may be or comprise an operational amplifier receiving a full range voltage (for example, VSS2 to VDD2). The level of an input voltage to the rail-to-rail amplifier may be within the full range of the supply voltage(s).

A source driver of a liquid crystal display apparatus may include one or more of the half-power buffer amplifiers shown in FIGS. 1A-1B. The half-power buffer amplifier may generate an output OUT configured to drive adjacent channels (or one of two adjacent channels) of a display panel, which is driven by the source driver. Here, each channel may signify a data line of the source driver that drives a pixel of the display panel.

The input unit 110 may be or comprise a differential amplifier (e.g., a complementary differential amplifier). For example, the input unit 110 may include a folded cascode operational transconductance amplifier (OTA).

The input unit 110 may differentially amplify the input signal INP/INN and generate first to fourth currents I1, I2, I3 and I4 based or in response to the differential input signal INP/INN.

For example, the differential amplifier may include a first N-type transistor Q1 and a second N-type transistor Q2 having a common source configuration, and a first bias unit Q3 connected to a second rail rail2 and configured to control the amount of current supplied to the common source of the first and second N-type transistors Q1 and Q2 in response to a bias voltage VBN1.

The first bias unit Q3 may be or comprise an N-type transistor having a gate configured to receive the bias voltage VBN1, and source and drain terminals connected to the second rail rail2 and the common source of the first and second N-type transistors Q1 and Q2. The second rail rail2 may supply a ground potential (for example, VSS2).

For example, the differential amplifier may further include a first P-type transistor P1 and a second P-type transistor P2 having a common source configuration, and a second bias unit P3 connected to a first rail rail1 and configured to control the amount of current supplied to the common source of the first and second P-type transistors P1 and P2 in response to a bias voltage VBP1.

The second bias unit P3 may be or comprise a P-type transistor having a gate configured to receive the bias voltage VBP1, and source and drain terminals connected to the first rail rail1 and the common source of the first and second P-type transistors P1 and P2.

The first rail rail1 may supply a first voltage (for example, VDD2) higher than the ground voltage VSS2.

The first part INN of the differential input signal may be received by the gates of the first N-type transistor Q1 and first P-type transistor P1. A second, complementary part INP of the differential input signal may be received by the gates of the second N-type transistor Q2 and second P-type transistor P2.

Each of the drains of the first and second N-type transistors Q1 and Q2 may be connected to a corresponding one of first and second input nodes N1 and N2 of a first current mirror 122 to be described later.

Each of the drains of the first and second P-type transistors P1 and P2 may be connected to a corresponding one of third and fourth input nodes N3 and N4 of a second current mirror 124 to be described later.

For example, the first current I1 maybe a current that flows between the drain of the first N-type transistor Q1 and the first input node N1. The second current I2 may be a current that flows between the drain of the second N-type transistor Q2 and the second input node N2. The third current I3 may be a current that flows between the drain of the first P-type transistor P1 and the third input node N3. The fourth current I4 may be a current that flows between the drain of the second P-type transistor P2 and the fourth input node N4.

The amplification unit 120 may include the first current mirror 122, the second current mirror 124, and a third bias unit 126. The first and second current mirrors 122 and 124 may each comprise a cascode current mirror.

The amplification unit 120 may further include a first node NO1 configured to output a first output, a second node NO2 configured to output a second output, a third node NO3 configured to output a third output, and a fourth node NO4 configured to output a fourth output.

The first current mirror 122 may include first and second transistors M1 and M2 connected in series at the first input node N1, and third and fourth transistors M3 and M4 connected in series at the second input node N2. The first input node N1 carries the first current I1, and the second input node N2 carries the second current I2.

The second current mirror 124 may include fifth and sixth transistors M5 and M6 connected in series at the third input node N3, and seventh and eighth transistors M7 and M8 connected in series at the fourth input node N4. The third input node N3 carries the third current I3, and the fourth input node N4 carries the fourth current I4.

The third bias unit 126 may be between the first current mirror 122 and the second current mirror 124.

The first current mirror 122 controls a voltage at the first node N01, which controls a P-type transistor M9 in a first output unit 130a, in response to at least one of the first and second currents I1 and I2 and a bias control voltage VBP2.

For example, the first current mirror 122 may include first and second transistors M1 and M2 connected in series between the first voltage VDD2 and a first intermediate node NP1, a third transistor M3 between the first voltage VDD2 and the second input node N2, and a fourth transistor M4 between the second input node N2 and the first node N01. The first and second transistors M1 and M2 may be connected to each other at the first input node N1.

The gates of the first and third transistors M1 and M3 may be connected to each other, the gates of the second and fourth transistors M2 and M4 may be connected to each other, and the gate(s) of the first transistor M1 and/or the third transistor M3 may be connected to the first intermediate node NP1.

For example, the first current mirror 122 may include first and second transistors M1 and M2 connected in series between the first rail rail1 and a first intermediate node NP1, and third and fourth transistors M3 and M4 connected in series between the first rail rail1 and the first node N01.

The gate of the first transistor M1 may be connected with the gate of the third transistor M3, the gate of the second transistor M2 may be connected with the gate of the fourth transistor M4, and the gate(s) of the first transistor M1 and/or the third transistor M3 may be connected to the source or drain of the second transistor M2.

The second current mirror 124 controls a voltage at the fourth node NO4, which controls an N-type transistor M12 of a second output unit 130b, in response to at least one of the third and fourth currents I3 and I4 and a bias control voltage VBN2.

For example, the second current mirror 124 may include fifth and sixth transistors M5 and M6 connected in series between the third voltage VSS2 and a second intermediate node NP2, a seventh transistor M7 between the fourth input node N4 and the fourth node NO4, and an eighth transistor M8 between the third voltage VSS2 and the fourth input node N4. The fifth and sixth transistors M5 and M6 may be connected to each other at the third input node N3.

The gates of the fifth and seventh transistors M5 and M7 may be connected to each other, the gates of the sixth and eighth transistors M6 and M8 may be connected to each other, and the gate(s) of the sixth transistor M6 and/or the eighth transistor M8 may be connected to the second intermediate node NP2.

The second current mirror 124 may include fifth and sixth transistors M5 and M6 connected in series between the second rail rail2 (e.g., a ground potential) and a second intermediate node NP2, and seventh and eighth transistors M7 and M8 connected in series between the second rail rail2 and the fourth node N04.

The gate of the fifth transistor M5 may be connected with the gate of the seventh transistor M7, the gate of the sixth transistor M6 may be connected with the gate of the eighth transistor M8, and the gate(s) of the sixth transistor M6 and/or the eighth transistor M8 may be connected to the source or drain of the fifth transistor M5.

The first intermediate node NP1 and the first node NO1 may be connection nodes between the first current mirror 122 and the third bias unit 126, and the second intermediate node NP2 and the fourth node NO4 may be connection nodes between the second current mirror 124 and the third bias unit 126.

For example, the first intermediate node NP1 may be a connection node between the second transistor M2 and a first bias circuit 126a, and the first node NO1 may be a connection node between the fourth transistor M4 and a second bias circuit 126b.

Also, the second intermediate node NP2 may be a connection node between the fifth transistor M5 and the first bias circuit 126a, and the fourth node NO4 may be a connection node between the seventh transistor M7 and a third bias circuit 126c.

The first input node N1 of the first current mirror 122 may be a connection node of the first transistor M1 and second transistor M2 connected in series, and the second input node N2 of the first current mirror 122 may be a connection node of the third transistor M3 and fourth transistor M4 connected in series.

The third input node N3 of the second current mirror 124 may be a connection node of the fifth transistor M5 and sixth transistor M6 connected in series, and the fourth input node N4 of the second current mirror 124 may be a connection node of the seventh transistor M7 and eighth transistor M8 connected in series.

The third bias unit 126 may be referred to as a floating current source, and include the first bias circuit 126a, the second bias circuit 126b, and the third bias circuit 126c.

The first bias circuit 126a may be between the second transistor M2 of the first current mirror 122 and the fifth transistor M5 of the second current mirror 124.

The second bias circuit 126b may be between the fourth transistor M4 of the first current mirror 122 and the third bias circuit 126c.

The third bias circuit 126c may be between the second bias circuit 126b and the seventh transistor M7 of the second current mirror 124.

The first bias circuit 126a may include an N-type transistor and a P-type transistor connected in parallel. The sources and drains of the N-type transistor and P-type transistor of the first bias circuit 126a may be connected to the first intermediate node NP1 and the second intermediate node NP2, respectively.

A corresponding one of bias voltages VBN3 and VBP3 may be provided to each of the gates of the N-type transistor and P-type transistor of the first bias circuit 126a.

The second bias circuit 126b may include an N-type transistor K1 and a P-type transistor K2 connected in series between the first node NO1 and a fifth node N5, and a P-type transistor K3 between the first node NO1 and the fifth node N5. The N-type transistor K1 and P-type transistor K2 connected in series may be connected in parallel with the P-type transistor K3.

The fifth node N5 may be a connection node of the second bias circuit 126b and the third bias circuit 126c. The second node NO2 may be a connection node of the N-type transistor K1 and P-type transistor K2 of the second bias circuit 126b.

A bias voltage VBNH3 may be provided to the gate of the N-type transistor K1 of the second bias circuit 126b, and a bias voltage VBPH3 may be provided to the gate of the P-type transistor K3 of the second bias circuit 126b. In addition, a second (e.g., inverted or complementary) polarity control signal POLB may be provided to the gate of the P-type transistor K2 of the second bias circuit 126b.

The third bias circuit 126c may include an N-type transistor K4 and a P-type transistor K5 connected in series between the fourth node NO4 and the fifth node N5, and an N-type transistor K6 connected between the fourth node NO4 and the fifth node N5. The N-type transistor K4 and P-type transistor K5 connected in series may be connected in parallel with the N-type transistor K6.

The third node NO3 may be a connection node of the N-type transistor K4 and P-type transistor K5 of the third bias circuit 126c.

A bias voltage VBPL3 may be provided to the gate of the P-type transistor K5 of the third bias circuit 126c, and a bias voltage VBNL3 may be provided to the gate of the N-type transistor K6 of the third bias circuit 126c. In addition, the second polarity control signal POLB may be provided to the gate of the N-type transistor K4 of the third bias circuit 126c.

Each of the first and second nodes NO1 and NO2 may be connected to the gate of a corresponding ninth transistor M9 and tenth transistor M10, respectively, in the first output unit 130a.

Each of the third and fourth nodes NO3 and NO4 may be connected to the gate of a corresponding eleventh transistor M11 and twelfth transistor M12, respectively, in the second output unit 130b.

The output unit 130 may include the first output unit 130a and the second output unit 130b.

A polarity-based inversion operation may be performed with respect to the panel of the display apparatus by the first output unit 130a and the second output unit 130b.

The first output unit 130a may output a voltage in a first voltage range (e.g., VDD2M to VDD2) and be referred to as a "positive output unit".

The second output unit 130b may output a voltage in a second voltage range (e.g., VSS2 to VDD2M) and be referred to as a "negative output unit".

The first output unit 130a may include a first output buffer unit (e.g., M9, M10, 151 and OUT1) between a first voltage source having the first voltage VDD2 and a second voltage source having a second voltage VDD2M, first and second connection switches 131a and 137a, a first driving switch 131b, and a first charge share switch unit 132.

The first output buffer unit may include a transistor M9 and a transistor M10 between the first voltage source having the first voltage VDD2 and the second voltage source having the second voltage VDD2M, a first control switch 151 coupled or connected between the transistor M9 and the transistor M10, and a first output node OUT1 at which the transistor M9 and the first control switch 151 are connected to each other.

The first control switch 151 may have a gate configured to receive the polarity signal POLB (which may be an inverted or complementary polarity signal), and a source and a drain between the transistor M9 and the transistor M10.

The second output unit 130b may include a second output buffer unit (e.g., M11, M12, 152 and OUT2) between the second voltage source and a third voltage source having the third voltage VSS2, third and fourth connection switches 137b and 134a, a second driving switch 134b, and a second charge share switch unit 135.

The second output buffer unit may include a transistor M11 and a transistor M12 between the second voltage source and the third voltage source, a second control switch 152 coupled or connected between the transistor M11 and the transistor M12, and a second output node OUT2 at which the second control switch 152 and the transistor M12 are connected to each other.

The second control switch 152 may have a gate configured to receive the polarity signal POLB (which may be an inverted or complementary polarity signal), and a source and a drain between the transistor M11 and the transistor M12.

The first control switch 151 and the second control switch 152 may be operated opposite to each other. For example, when the first control switch 151 is on, the second control switch 152 may be off. Alternatively, for example, when the first control switch 151 is off, the second control switch 152 may be on.

For example, the first control switch 151 and the second control switch 152 may be or comprise transistors of different polarities or types. For example, although the first control switch 151 may be or comprise a P-type transistor and the second control switch 152 may be or comprise an N-type transistor, they are not limited thereto, and may be or comprise transistors of opposite polarities or types. In other embodiments, the first control switch 151 and the second control switch 152 may be or comprise transistors of the same polarity, but receiving complementary polarity signals.

Based on or in response to the polarity signal POLB, the first and second control switches 151 and 152 may electrically connect or disconnect the output node OUT from the transistors M10 and M11 of the first and second output buffer units.

The source (or drain) of the transistor M10 may be electrically connected to the body of the transistor M10. The source (or drain) of the transistor M11 may be electrically connected to the body of the transistor M11. Here, the body of the transistor may signify a bulk, a bulk node or a body node of the transistor.

For example, the source and body of the transistor M10 may be connected to a sixth node N6, thereby causing the source and body of the transistor M10 to have the same potential. As a result, it may be possible to prevent an increase in the threshold voltage of the transistor M10 resulting from a body effect.

Also, the source and body of the transistor M11 may be connected to the sixth node N6, thereby causing the source and body of the transistor M11 to have the same potential. As a result, it may be possible to prevent an increase in the threshold voltage of the transistor M11 resulting from a body effect.

The sixth node N6 may be a connection node of the transistor M10 and the transistor M11. For example, the sixth node N6 may be a node at which the source of the transistor M10 and the source of the transistor M11 are connected.

The second voltage VDD2M may be provided to the connection node N6 of the first output buffer unit and the second output buffer unit. For example, the connection node N6 of the transistor M10 of the first output buffer unit and the transistor M11 of the second output buffer unit may be connected to the second voltage source.

Although the first output node OUT1 and the second output node OUT2 may be connected to each other (e.g., at the output node OUT of the output unit 130) and thus form a common output node with the output node OUT, they are not limited thereto. In other embodiments, the output unit 130 may have a first output node (e.g., OUT1) and a second output node (e.g., OUT2) disconnected from each other.

By selective switching operations of the first to fourth connection switches 131a, 137a, 137b and 134a and the first and second driving switches 131b and 134b, one of the first output unit 130a and second output unit 130b may be selectively turned on, and the other one may be selectively turned off.

For example, based on or in response to signals PHD, PHDB, PLD and PLDB, the first to fourth connection switches 131a, 137a, 137b and 134a and the first and second driving switches 131b and 134b may be selectively turned on or off.

The first connection switch 131a may be between the first node NO1 and the gate of the transistor M9, and may be turned on or off based on or in response to the signal PHD.

The first driving switch 131b may be between the first voltage source and the gate of the transistor M9, and may be turned on or off based on or in response to the signal PHDB.

The second connection switch 137a may be between the second node NO2 and the gate of the transistor M10, and may be turned on or off based on or in response to the signal PHD.

For example, the first connection switch 131a, the second connection switch 137a and the first driving switch 131b may each be or comprise, but is/are not limited to, a P-type transistor (for example, a PMOS transistor).

The third connection switch 137b may be between the third node NO3 and the gate of the transistor M11, and may be turned on or off based on or in response to the signal PLD.

The fourth connection switch 134a may be between the fourth node NO4 and the gate of the transistor M12, and may be turned on or off based on or in response to the signal PLD.

The second driving switch 134b may be between the third voltage source and the gate of the transistor M12, and may be turned on or off based on or in response to the signal PLDB.

For example, the third connection switch 137b, the fourth connection switch 134a and the second driving switch 134b may each be or comprise, but is/are not limited to, an N-type transistor (for example, an NMOS transistor).

The first and second connection switches 131a and 137a may be or comprise, but are not limited to, transistors of opposite polarities to those of the third and fourth connection switches 137b and 134a.

The first driving switch 131b may be or comprise, but are not limited to, a transistor of an opposite polarity to that of the second driving switch 134b. For example, the first driving switch 131b may be or comprise a P-type transistor, and the second driving switch 134b may be or comprise an N-type transistor. The signals PHD and PLD as shown in FIG. 1B may have a same state and/or may be the same signal or copies of the same signal. Similarly, the signals PHDB and PLDB as shown in FIG. 1B may have a same state and/or may be the same signal or copies of the same signal.

By selective switching of the first and second charge share switch units 132 and 135, the voltage at the output node OUT1 of the first output unit 130a may fall from the first voltage VDD2 to the second voltage VDD2M or rise from the third voltage VSS2 to the second voltage VDD2M, which may be called a "charge share operation".

The first charge share switch unit 132 may be between the gate of the transistor M10 and the first voltage source, and may be turned on or off based on or in response to signals POLB and CSP.

For example, the first charge share switch unit 132 may include first and second charge share switches 132a and 132b connected in series between the gate of the transistor M10 and the first voltage source (e.g., VDD2).

The first charge share switch 132a may be turned on or off based on or in response to the second polarity control signal POLB, and the second charge share switch 132b may be turned on or off based on or in response to the signal CSP.

For example, the first charge share switch 132a and the second charge share switch 132b may be, but not limited to, transistors of the same polarity, for example, P-type transistors. In various embodiments, the first charge share switch 132a and the second charge share switch 132b may be or comprise N-type transistors. In another embodiment, the first charge share switch 132a and the second charge share switch 132b may be or comprise transistors of different polarities.

The second charge share switch unit 135 may be between the gate of the transistor M11 and the third voltage source, and may be turned on or off based on or in response to signals POLB and CSN.

For example, the second charge share switch unit 135 may include third and fourth charge share switches 135a and 135b connected in series between the gate of the transistor M11 and the third voltage source (e.g., VSS2).

The third charge share switch 135a may be turned on or off based on or in response to the second polarity control signal POLB, and the fourth charge share switch 135b may be turned on or off based on or in response to the signal CSN.

For example, the third charge share switch 135a and the fourth charge share switch 135b may be or comprise, but are not limited to, transistors of the same polarity, for example, N-type transistors. In another embodiment, the third and fourth charge share switches 135a and 135b may be or comprise P-type transistors. In other embodiments of the present invention, the third charge share switch 135a and the fourth charge share switch 135b may be or comprise transistors of different polarities.

The first and second charge share switches 132a and 132b of the first output unit 130a may be or comprise, but are not limited to, transistors of opposite polarities to those of the third and fourth charge share switches 135a and 135b of the second output unit 130b.

The first and second charge share switch units 132 and 135 may be controlled such that the voltage at the output node OUT becomes the second voltage VDD2M in a second (e.g., charge sharing) operation period S2 between a first (e.g., first driving) operation period S1 and a third (e.g., second driving) operation period S3.

For example, the first charge share switch unit 132 may perform a first charge share operation by controlling the transistor M10 based on or in response to the signals POLB and CSP, such that the voltage at the first output node OUT1 becomes the second voltage VDD2M.

Also, for example, the second charge share switch unit 135 may perform a second charge share operation by controlling the transistor M11 based on or in response to the signals POLB and CSN, such that the voltage at the second output node OUT2 becomes the second voltage VDD2M. The first and second charge sharing operations may be conducted simultaneously.

The second connection switch 137a may, based on or in response to the signal PHD, disconnect or float the gate of the transistor M10 of the output unit 130 from the second node NO2 of the amplification unit 120 in the first charge share operation. Also, the third connection switch 137b may, based on or in response to the signal PLD, disconnect or float the gate of the transistor M11 of the output unit 130 from the third node NO3 of the amplification unit 120 in the second charge share operation. At the same time, the signals PHD and PLD may disconnect the first and fourth connection switches 131a and 134a during the first and second charge share operations, respectively, enabling the first and second driving switches to control the voltage at the gates of the ninth and the twelfth transistors, M9 and M12, respectively.

The output unit 130 may further include a first switch 141 and a second switch 142.

The first switch 141 and the second switch 142 may be or comprise transistors of different polarities. The first switch 141 and the second switch 142 may be operated opposite to each other.

For example, when the first switch 141 is on, the second switch 142 may be off. Alternatively, when the second switch 142 is off, the first switch 141 may be on. In other embodiments, the first switch 141 and the second switch 142 may be or comprise transistors of the same polarity, but may receive signals having opportunity or complementary states.

For example, the first output unit 130a may further include the first switch 141, and the second output unit 130b may further include the second switch 142.

The first switch 141 may be between the gate of the transistor M10 and the connection node N6, and be turned on or off by the second polarity control signal POLB. For example, although the first switch 141 may be an N-type transistor (for example, an NMOS transistor), it is not limited thereto and may be or comprise a transistor of the opposite polarity or type.

The second switch 142 may be between the gate of the transistor M11 and the connection node N6 and be turned on or off by the signal POLB. For example, although the second switch 142 may be a P-type transistor (for example, a PMOS transistor), it is not limited thereto and may be or comprise a transistor of the opposite polarity or type.

For example, the first and second switches 141 and 142 may be selectively turned on or off based on or in response to the second polarity control signal POLB.

Figure 2:
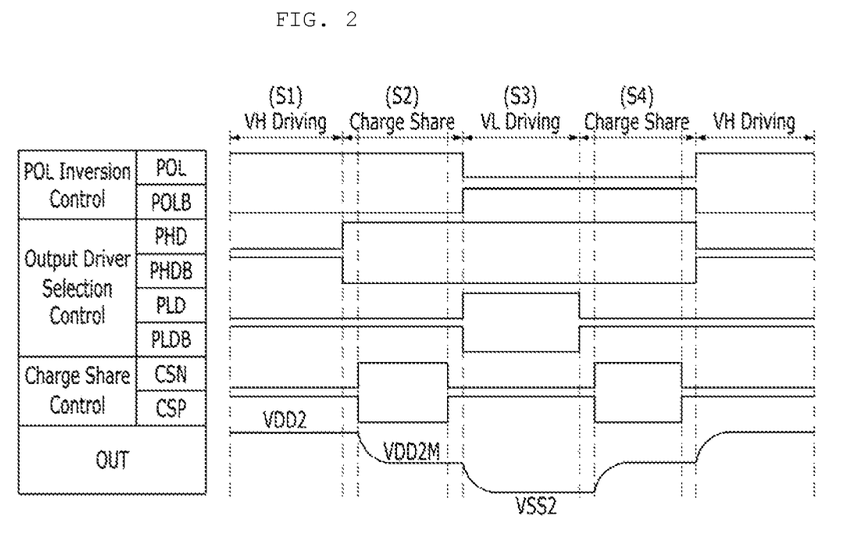
FIG. 2 is a timing diagram of signals that control the exemplary half-power buffer amplifier according to the embodiments of the present invention.

FIG. 2 is a timing diagram of signals configured to control of the exemplary half-power buffer amplifier according to the various embodiments of the present invention. That is, FIG. 2 is a timing diagram of first and second polarity control signals POL and POLB, signals PHD, PHDB, PLD and PLDB, charge share control signals CSN and CSP, and the output signal OUT.

Referring to FIG. 2, POL may be the first polarity control signal, and POLB may be the second polarity control signal, which may be an inverted first polarity control signal POL.

PHD may be an inverted PHDB signal, and PLD may be an inverted PLDB signal.

When the first polarity control signal POL has a first level (for example, a high binary logic level) and optionally the signal PHD has a second level (e.g., a low binary logic level), the second output unit 130*b* may be turned off, the first output unit 130*a* may be connected with a part of the first output stage (for example, the first and second nodes NO1 and NO2 of the amplification unit 120), and the first control switch 151 of the first output unit 130*a* may be turned on, thereby causing a positive voltage (e.g., in the range of VDD2M to VDD2) to be output through the output node OUT (e.g., in the first driving operation S1).

Subsequently, during the first charge share operation S2, an electrical connection of the second output stage (for example, the first output unit 130*a* and the second output unit 130*b*) with the first output stage (for example, the first to fourth nodes NO1 to NO4) may be opened or cut off, and the transistors M9 and M10 may be turned off.

In FIG. 2, when the first charge share control signal CSP goes from the first level to the second level, the first voltage VDD2 from the first voltage source may be applied to the gate of the transistor M10, so as to fully turn on the transistor M10, thereby causing the second voltage to be discharged at the output node OUT. In the first charge share operation S2, the driver selection control signals PHD and PLD may be at the first and second levels, respectively.

A description will hereinafter be given of a first operation (e.g., a VH driving operation) S1 of the half-power buffer amplifier according to various embodiments of the present invention.

In the first (e.g., high voltage driving) operation S1, the first polarity control signal POL, the signal PLDB, the signal PHDB and the first charge share control signal CSP may each have the first level (for example, the high binary logic level), and the second polarity control signal POLB, the signal PHD, the signal PLD and the second charge share control signal CSN may each have the second level (for example, a low binary logic level).

In the first operation S1, the first connection switch 131*a* may be turned on, so as to connect the first node NO1 and the gate of the transistor M9, the first driving switch 131*b* may be turned off.

In the first operation S1, the second connection switch 137*a* may be turned on, so as to connect the second node NO2 and the gate of the transistor M10, the first charge share switch 132*a* may be on, and the second charge share switch 132*b* may be off.

In the first operation S1, the first control switch 151 may be on, and the second control switch 152 may be off.

In the first operation S1, the third connection switch 137*b* and the third and fourth charge share switches 135*a* and 135*b* may be off, and the transistor M11 may be off.

In the first operation S1, the fourth connection switch 134*a* may be off, the second driving switch 134*b* may be on, and the transistor M12 may be off.

In the first operation S1, the first switch 141 may be off, and the second switch 142 may be on.

In the first operation S1, the first output buffer unit of the first output unit 130*a* may be controlled by the output voltages from the first and second nodes NO1 and NO2 of the amplification unit 120, the output node OUT may output a voltage in the first voltage range (e.g., VDD2M to VDD2), and the second output unit 130*b* may be turned off.

Next, a description will be given of a second operation (e.g., a first charge share operation) S2 of the half-power buffer amplifier according to embodiments of the present invention.

In the second operation S2, the first polarity control signal POL, the signal PHD, the signal PLDB and the second charge share control signal CSN may each have the first level (e.g., the high binary logic level), and the second polarity control signal POLB, the signal PHDB, the signal PLD and the first charge share control signal CSP may each have the second level (e.g., the low binary logic level). Namely, as compared with the first operation, in the second operation, the signals PHD, PHDB, CSN and CSP have a different binary logic level (e.g., are inverted).

In the second operation S2, the first connection switch 131*a* may be off and the first driving switch 131*b* may be on, so that the first voltage source may be connected to the gate of the transistor M9, thereby causing the transistor M9 to be turned off.

In the second operation S2, the second connection switch 137*a* may be off, so that the gate of the transistor M10 may be disconnected from the second node NO2 of the amplification unit 120.

In the second operation S2, the first and second charge share switches 132*a* and 132*b* may be turned on, so that the first voltage source may be connected to the gate of the transistor M10, thereby causing the transistor M10 to be turned on. As a result, the connection node N6 may be electrically connected to the first output node OUT1. The complementary polarity control signal POLB having the second binary logic level, so switch 141 is off, disconnecting the connection node N6 from the gate of transistor M10.

In the second operation S2, because the transistor M9 of the first output buffer unit is turned off and the transistor M10 thereof is turned on, the voltage at the first output node OUT1 of the first output buffer unit may change from the voltage in the first driving operation (e.g., the first voltage VDD2) to the second voltage VDD2M.

Next, a description will be given of a third operation (e.g., a VL driving operation) S3 of the half-power buffer amplifier according to various embodiments.

In the third (e.g., low voltage driving) operation S3, the second polarity control signal POLB, the signal PHD, the signal PLD and the first charge share control signal CSP may each have the first level (for example, the high binary logic level), and the first polarity control signal POL, the signal PHDB, the signal PLDB and the second charge share control signal CSN may each have the second level (for example, the low binary logic level).

In the third operation S3, the fourth connection switch 134*a* may be on and the second driving switch 134*b* may be off, so that the fourth node NO4 and the gate of the transistor M12 may be connected.

In the third operation S3, the third connection switch 137b may be on, so as to connect the third node NO3 and the gate of the transistor M11. The third charge share switch 135a may be on, and the fourth charge share switch 135b may be off.

In the third operation S3, the first switch 141 may be on, and the second switch 142 may be off. In the third operation S3, the second control switch 152 may be on.

In the third operation S3, the second output buffer unit of the second output unit 130b may be controlled by the output voltages from the third and fourth nodes NO3 and NO4 of the amplification unit 120, the output node OUT may output a voltage in the second voltage range (e.g., VSS2 to VDD2M), and the first output unit 130a may be turned off.

Next, a description will be given of a fourth operation (e.g., a second charge share operation) S4 of the half-power buffer amplifier according to various embodiments.

In the fourth operation S4, the second polarity control signal POLB, the signal PHD, the signal PLDB and the second charge share control signal CSN may each have the first level (for example, the high binary logic level), and the first polarity control signal POL, the signal PHDB, the signal PLD and the first charge share control signal CSP may each have the second level (for example, the low binary logic level). As compared with the third operation, in the fourth operation S4, the signals PLD, PLDB, CSP and CSN have a different binary logic level (e.g., are inverted).

In the fourth operation S4, the fourth connection switch 134a and the third connection switch 137b may be off and the second driving switch 134b may be on, thereby causing the transistor M12 to be turned off.

In the fourth operation S4, the third connection switch 137b may be off, so that the gate of the transistor M11 may be disconnected from the third node NO3 of the amplification unit 120.

In the fourth operation S4, the third and fourth charge share switches 135a and 135b may be turned on, so that the third voltage source may be connected to the gate of the transistor M11, thereby causing the transistor M11 to be turned on. As a result, the connection node N6 may be electrically connected to the second output node OUT2. The complementary polarity control signal POLB has the first binary logic level, so switch 142 is off, disconnecting the connection node N6 from the gate of transistor M11.

In the fourth operation S4, because the transistor M12 of the second output buffer unit is turned off and the transistor M11 thereof is turned on, the voltage at the second output node OUT2 of the second output buffer unit and the voltage at the output node OUT may each change from the voltage in the second driving operation (e.g., the third voltage VSS2) to the second voltage VDD2M.

As described above, the embodiments of the present invention provide a configuration enabling dot inversion using half power. Further, because the input unit 110, the amplification unit 120 and the first and second output units 130a and 130b may be driven with half-power voltages, the embodiments enable a low-power design using half power.

In addition, because a separate output multiplexer and a separate charge share switch need not be present, the present embodiments enable a small-area design.

Further, because the separate output multiplexer need not be present, the output on the output node OUT may be have a high slew rate, resulting in a reduction in the heat generated the source driver.

In addition, according to the present embodiments, the output unit 130 may have a full-power configuration, so that offset performance may be secured without increasing the sizes of matching pair transistors. The output unit 130 may include a circuit capable of selecting a positive output stage (e.g., the first output buffer unit) and a negative output stage (e.g., the second output buffer unit) on a channel basis, so that horizontal inversion may be performed with no additional output stage.

Further, according to the present embodiments, the body of the transistor M10 and the body of the transistor M11 may be connected to the second voltage source (e.g., the second voltage VDD2M), thereby making it possible to remove a body effect and, in turn, a threshold voltage increase in the transistors M10 and M11 of the output unit 130 to improve driving performance of the half-power buffer amplifier.

Figure 3:
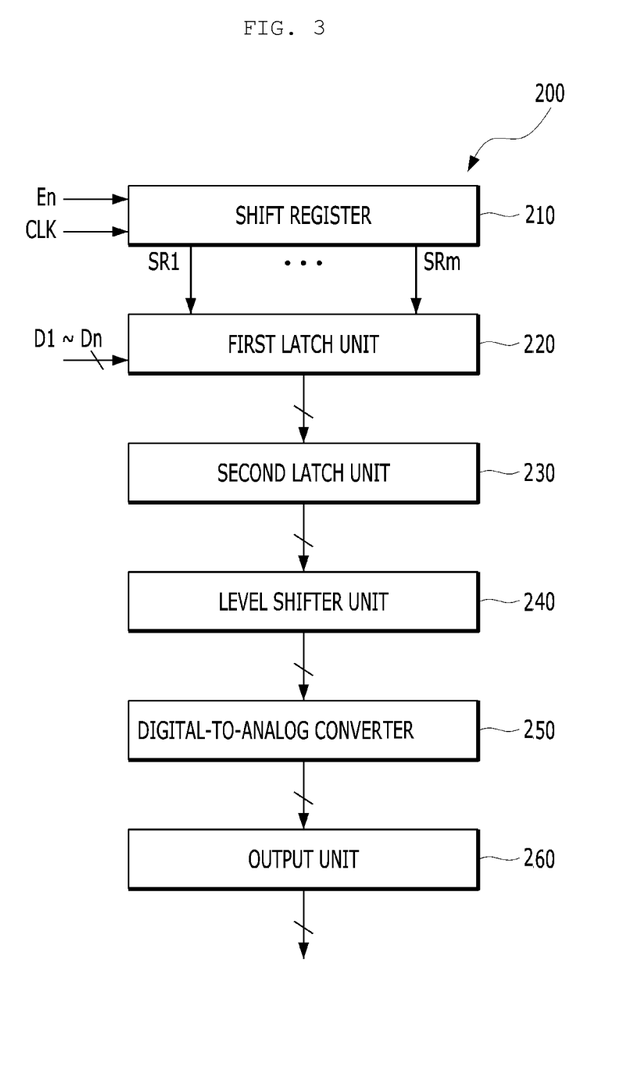
FIG. 3 is a schematic block diagram of an exemplary source driver according to one or more embodiments of the present invention.

FIG. 3 is a schematic block diagram of an exemplary source driver 200 according to one or more embodiments of the present invention.

Referring to FIG. 3, the source driver 200 includes a shift register 210, a first latch unit 220, a second latch unit 230, a level shifter unit 240, a digital-to-analog converter unit 250, and an output unit 260.

The shift register 210 generates shift signals SR1 to SRm (m being a natural number greater than 1) in response to an enable signal En and a clock signal CLK to control the timing of data (e.g., digital image data) being sequentially stored in the first latch unit 220.

For example, the shift register 210 may generate the shift signals SR1 to SRm (m being a natural number greater than 1) by receiving a horizontal start signal from a timing controller (not shown) and shifting the received horizontal start signal in response to the clock signal CLK. Here, the horizontal start signal may be used interchangeably with a start pulse.

The first latch unit 220 stores data D1 to Dn (n being a natural number greater than 1) received from the timing controller (not shown) in response to the shift signals SR1 to SRm (m being a natural number greater than 1) generated by the shift register 210.

The first latch unit 220 may include a plurality of first latches (not shown), which may store the data D1 to Dn (n being a natural number greater than 1).

For example, the data received from the timing controller (305 in FIG. 5) may be red (R), green (G) and blue (B) data, and the first latches of the first latch unit 220 may store the R, G and B data.

Namely, the data D1 to Dn (n being a natural number greater than 1) received from the timing controller 305 may be sequentially stored in the first latches included in the first latch unit 220 in response to the shift signals SR1 to SRm (m being a natural number greater than 1).

The second latch unit 230 stores output data from the first latch unit 220 in response to a control signal provided from the timing controller 305.

For example, the second latch unit 230 may store the data from the first latch unit 220 in units of horizontal line periods.

For example, one horizontal line period may be a time period taken to completely store data corresponding to one horizontal line (304 in FIG. 5) of a display panel in the first latches of the first latch unit 220.

For example, the horizontal line period may be a period between a first point in time and a second point in time.

The first point in time may be a time at which the data in the first latch unit 220, is transferred to the second latch unit 230, and the data from the second latch unit 230 is output as a first analog signal through the level shifter unit 240 and the digital-to-analog converter unit 250. The second point in time may be a time at which the data in the first latch unit 220 is transferred to the second latch unit 230 in response to a horizontal line signal of the next period, and the data from the second latch unit 230 is output as a second analog signal through the level shifter unit 240 and the digital-to-analog converter unit 250.

Alternatively, the horizontal line period may signify one period of the horizontal line signal.

The second latch unit 230 may include a plurality of second latches, and the number of second latches may be the same as the number of first latches.

The level shifter unit 240 shifts the voltage level of data received from the second latch unit 230. For example, the level shifter unit 240 may convert a first voltage level of the data received from the second latch unit 230 to a second voltage level.

For example, the level shifter unit 240 may include a plurality of level shifters, which may, but does not necessarily, have the same number of level shifters as the number of first latches and/or second latches.

The digital-to-analog converter unit 250 converts the output (e.g., digital data) from the level shifter unit 240 into an analog signal. For example, the digital-to-analog converter unit 250 may include a plurality of digital-to-analog converters corresponding to the plurality of level shifters.

For example, the digital-to-analog converter unit 250 may receive grayscale voltages from a voltage generator (not shown), and convert an output from the level shifter unit 240 into an analog signal based on or in response to the received grayscale voltages.

The output unit 260 amplifies (and/or buffers) an analog signal output from the digital-to-analog converter unit 250 and outputs the amplified (and/or buffered) analog signal.

The output unit 260 may include a plurality of amplifiers configured to amplify the analog signals from the digital-to-analog converters. Additionally or alternatively, the output unit 260 may include buffers configured to buffer the analog signals from the digital-to-analog converters.

The output unit 260 may include the half-power buffer amplifier according to the above-described embodiments. For example, the output unit 260 may include a plurality of half-power buffer amplifiers, each of which may amplify a corresponding one of analog signals output from the digital-to-analog converter unit 250 and provide the amplified analog signal to a corresponding one of a plurality of data lines. For example, each of the plurality of half-power buffer amplifiers may be the half-power buffer amplifier according to the embodiment of FIG. 1A and FIG. 1B.

Figure 5:
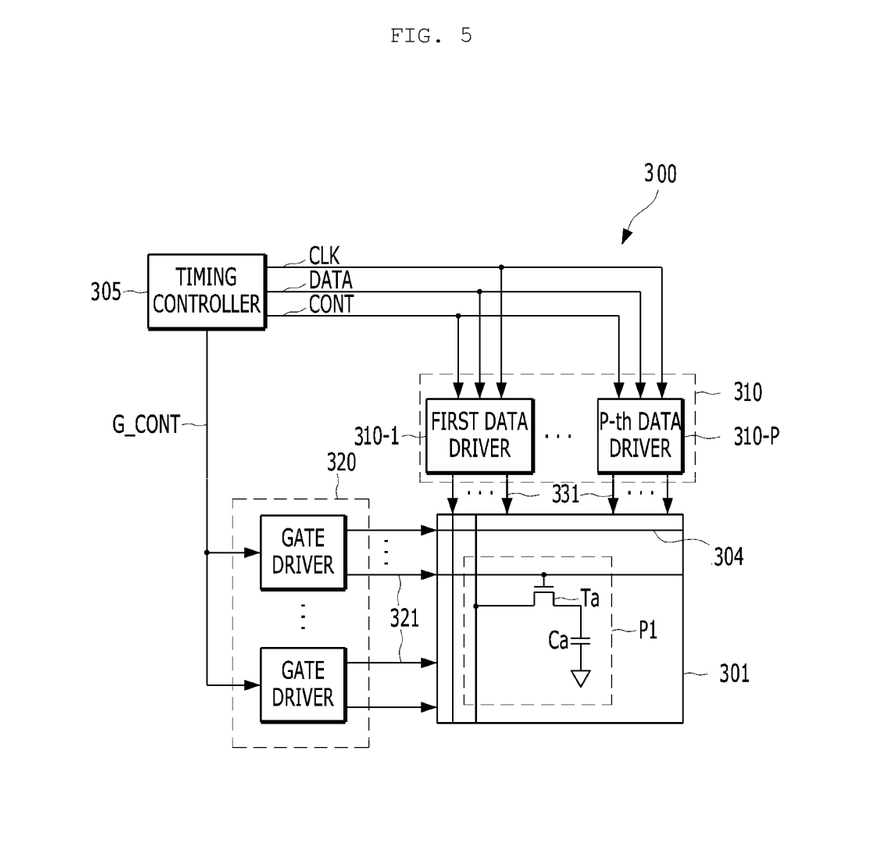
FIG. 5 is a schematic view of an exemplary display apparatus including a source driver according to one or more embodiments of the present invention.

FIG. 5 shows the configuration of an exemplary display apparatus 300 including the source driver 200 according to one or more embodiments of the present invention.

Referring to FIG. 5, the display apparatus 300 includes a display panel 301, a controller (or "timing controller") 305, a source driver unit 310, and a gate driver unit 320.

The display panel 301 may include gate lines 321 forming rows, and data lines 331 forming columns. The gate lines 321 and the data lines 331 cross each other, thereby forming a matrix. The display panel 301 may also include pixels (for example, P1) connected to the gate lines 321 and data lines 331 at respective intersections of the gate and data lines 321 and 331. The pixels P1 may be plural in number. Each pixel P1 may include a transistor Ta and a capacitor Ca.

The controller 305 outputs a clock signal CLK, data DATA, a data control signal CONT configured to control the source driver unit 310, and a gate control signal G CONT configured to control of the gate driver unit 320.

For example, the data control signal CONT may include a horizontal start signal input to a shift register (210 in FIG. 3) of the source driver, a first control signal LD, an enable signal En, and the clock signal CLK.

The gate driver unit 320 drives the gate lines 321. The gate driver unit 320 may include a plurality of gate drivers. The gate driver unit 320 may output gate control signals configured to control of the transistors Ta of the pixels connected to the gate lines.

The source driver unit 310 drives the data lines 331. The source driver unit 310 may include a plurality of source drivers 310-1 to 310-P (P being a natural number greater than 1).

Each of the source drivers 310-1 to 310-P (P being a natural number greater than 1) may be the source driver 200 shown in FIG. 3.

As is apparent from the above description, according to various embodiments, it may be possible to remove a body effect and, in turn, an increase in the threshold voltage of transistors in an output unit to improve driving performance.

The various embodiments as described above may include particular features, structures, or characteristics, but not every embodiment necessarily includes the particular features, structures, or characteristics. Furthermore, the particular features, structures or characteristics in one or more embodiments of the present invention may be combined in any suitable manner, as would be apparent to one of ordinary skill in the art from this disclosure, in one or more embodiments. Therefore, combinations of features of different embodiments are meant to be within the scope of the invention.

What is claimed is:

1. A half-power buffer amplifier comprising:
an amplifier configured to differentially amplify differential input signals, the amplifier comprising first to fourth nodes configured to output differentially amplified output signals;
a first output buffer comprising a first transistor and a second transistor between a first voltage source having a first voltage and a second voltage source having a second voltage, and a first output node to which the first and second transistors are connected, the first transistor having a gate connected to the first node, the second transistor having a gate connected to the second node;
a second output buffer comprising a third transistor and a fourth transistor between a third voltage source having a third voltage and the second voltage source, wherein the third and fourth transistors are connected to a second output node, the third transistor having a gate connected to the third node, the fourth transistor having a gate connected to the fourth node;
a first control switch between the first output node and the second transistor and controlled by a polarity control signal;
a second control switch between the second output node and the third transistor and controlled by a complement of the polarity control signal;
a connection node between the second transistor and the third transistor, connected to the second voltage source;
a first switch between the connection node and the gate of the second transistor;
a second switch between the connection node and the gate of the third transistor, wherein the first switch and the second switch are turned on or off opposite to each other;
a first connection switch between the first node and the gate of the first transistor;
a second connection switch between the second node and the gate of the second transistor;

a third connection switch between the third node and the gate of the third transistor; and a fourth connection switch between the fourth node and the gate of the fourth transistor.

2. The half-power buffer amplifier according to claim 1, wherein each of the first switch and second switch is turned on or off based on or in response to the polarity control signal and/or the complement of the polarity control signal.

3. The half-power buffer amplifier according to claim 1, wherein the first voltage is higher than the second voltage, and the second voltage is higher than the third voltage.

4. The half-power buffer amplifier according to claim 1, wherein the second transistor has a source and a body electrically connected together, and the third transistor has a source and a body electrically connected together.

5. The half-power buffer amplifier according to claim 4, wherein the source of the second transistor and the source of the third transistor are each connected to the connection node.

6. The half-power buffer amplifier according to claim 1, further comprising:
a first driving switch between the first voltage source and the gate of the first transistor; and
a second driving switch between the third voltage source and the gate of the fourth transistor.

7. The half-power buffer amplifier according to claim 1, further comprising:
first and second charge share switches between the gate of the second transistor and the first voltage source; and
third and fourth charge share switches between the gate of the third transistor and the third voltage source.

8. The half-power buffer amplifier according to claim 7, wherein:
the first charge share switch is turned on or off based on or in response to a first charge share control signal, and the third charge share switch is turned on or off based on or in response to a second charge share control signal, and
each of the second charge share switch and fourth charge share switch is turned on or off based on or in response to the polarity control signal.

9. The half-power buffer amplifier according to claim 8, wherein the second charge share switch and the fourth charge share switch are transistors having opposite polarities or types.

10. The half-power buffer amplifier according to claim 1, wherein:
each of the first and second connection switches comprises a P-type transistor, and
each of the third and fourth connection switches comprises an N-type transistor.

11. The half-power buffer amplifier according to claim 6, wherein:
each of the first and second connection switches is turned on or off by a first signal, and
each of the third and fourth connection switches is turned on or off by a second signal.

12. The half-power buffer amplifier according to claim 11, wherein:
the first driving switch is turned on or off by a third signal, and
the second driving switch is turned on or off by a fourth signal,
wherein the third signal comprises an inverted first signal, and the fourth signal comprises an inverted second signal.

13. A source driver comprising:
a latch configured to store data;
a level shifter configured to shift a voltage level of data from the latch;
a digital-to-analog converter configured to convert an output from the level shifter into an analog signal; and
an output buffer comprising the half-power buffer amplifier according to claim 1, configured to amplify and output the analog signal.

14. A display apparatus comprising:
a display panel comprising gate lines, data lines, and pixels connected to the gate lines and the data lines, the pixels being in a matrix including rows and columns;
the source driver according to claim 13, configured to drive the data lines; and
a gate driver configured to drive the gate lines.

* * * * *